United States Patent
Buszko et al.

[11] Patent Number: 5,942,930
[45] Date of Patent: Aug. 24, 1999

[54] SHAPING AND LEVEL ADJUSTING FILTER

[75] Inventors: Eugenia Buszko, Somerville; Robert Daniel Decasse, Roselle; Leonid Strakovsky, Rumson, all of N.J.

[73] Assignee: Lucent Technologies, Inc., Murray Hill, N.J.

[21] Appl. No.: 08/936,821

[22] Filed: Sep. 25, 1997

[51] Int. Cl.$^6$ .............................. H03K 5/00; G05F 1/10
[52] U.S. Cl. ..................... 327/308; 327/306; 327/552; 327/553; 327/558; 327/311; 327/478
[58] Field of Search ................... 327/311, 312, 327/58, 62, 306, 307, 551, 552, 478, 558

[56] References Cited

U.S. PATENT DOCUMENTS 3,798,559  3/1974  Tomita et al. .................. 327/311

Primary Examiner—Dinh Le

[57] ABSTRACT

An electrical circuit is disclosed that is capable of adjusting the peak-to-peak voltage of a binary signal symmetrically around a reference voltage, without human intervention and without introducing a transient response into the signal. One embodiment of the circuit comprises a current source, five resistors and two diodes, create an intelligent "voltage divider" that adjusts the peak-to-peak voltage of a binary signal symmetrically around a reference voltage.

20 Claims, 3 Drawing Sheets

SHAPING AND LEVEL ADJUSTING FILTER

FIELD OF THE INVENTION

The present invention relates to electronics in general, and, more particularly, to a circuit for shaping and adjusting the peak-to-peak voltage of a binary signal.

BACKGROUND OF THE INVENTION

FIG. 1 depicts a schematic diagram of a circuit in the prior art that is often used for trimming the peak-to-peak voltage of a binary signal. For the purposes of this specification, the peak-to-peak voltage of a binary signal is defined as the difference between the voltage of the signal when it represents a binary "1" minus the voltage of the signal when it represents a binary "0." For example, when standard TTL circuitry is used and $V_{cc}$ is 5 volts, a binary "1" is typically represented by 4.0 volts, a binary "0" is typically represented by 0.3 volts, and, therefore, the peak-to-peak voltage of that signal is 3.7 volts.

When the binary signal is used as the input to an analog circuit (e.g., a voltage-controlled oscillator that uses the binary signal to modulate a carrier as in a frequency-shift keying modulation scheme), it is often necessary that the peak-to-peak voltage at the input to the analog circuit be precisely tuned, and that the peak-to-peak voltage be centered around the linear region of operation of the analog circuit (usually about Vcc/2).

The schematic in FIG. 1 comprises: signal source 101, trimming potentiometer 103, capacitor 105 and signal destination 107. Signal source 101 has a tri-state output and signal destination 107 is an active analog circuit such as a voltage-controlled oscillator.

When signal source 101 outputs a signal, trimming potentiometer 103 can be adjusted to affect the peak-to-peak voltage of the binary signal entering signal destination 107. When signal source 101 enters the high-impedance state, no current flows on lead 102 and any residual voltage on lead 102 falls to zero. Analogously, no current flows on lead 104 and any residual voltage on lead 104 falls to zero. When the voltage on lead 104 falls to zero, a current flows on lead 106 from the active circuitry within signal destination 107 and typically charges capacitor 105 to a voltage that is centered around the linear region of operation of the analog circuit (usually about Vcc/2). This charging of capacitor 105 is disadvantageous because the voltage on lead 106 is the sum of the voltage across capacitor 105 plus the voltage on lead 104, and, therefore, when signal source 101 exits the high-impedance state, the voltage on lead 106 can rise above the operating range of signal destination 107.

For example, FIG. 2 depicts a graph of the voltage on lead 102, which represents an illustrative binary signal from signal source 101. For the first four time periods shown, a time-varying binary signal is output by signal source 101. At t=4, signal source 101 enters the high-impedance state and the voltage on lead 102 falls from its prior value towards zero. At t=7, signal source 101 exits the high-impedance state and again outputs a time-varying binary signal.

FIG. 3 depicts a graph of the voltage on lead 106 that is caused by the binary signal in FIG. 2. For the first four time periods, the voltage on lead 106 follows the voltage on lead 102. When at t=4 signal source 101 enters the high-impedance state the voltage on lead 106 tends towards the voltage in the center of the region of linearity of signal destination 109. When at t=7 signal source 101 exits the high-impedance state the voltage on lead 106 immediately becomes the sum of the voltage on lead 104 plus the voltage across capacitor 106. This causes the voltage on lead 106 to be higher than desired until the time that capacitor 105 discharges and equilibrium is restored (at about t=17). When the voltage on lead 106 is higher than the expected operating range, those bits output by signal source 101 will be misinterpreted by signal destination 107.

In summary, the circuit depicted in FIG. 1 has three principal disadvantages. The first disadvantage is that trimming potentiometer 103 must be manually and mechanically adjusted. This necessitates the need for human intervention and opens the possibility for human error. Furthermore, because trimming potentiometer 103 is a mechanical device the possibility exists that it will untune from vibration and/or thermal cycling.

The second disadvantage of this circuit is that the process of adjusting trimming potentiometer 103 affects both the peak-to-peak voltage on lead 106 and the voltage of symmetry (i.e., the DC frequency component) of the signal, which can make tuning the circuit difficult or impossible, because it provides only one degree of freedom to affect two independent parameters. The third disadvantage of this circuit is that the first few bits output by signal source 101 are misinterpreted after signal source 101 exits the high-impedance state.

Therefore, the need exists for a circuit that can be tuned without human intervention, that allows the peak-to-peak voltage to be tuned independently of the voltage of symmetry and that does not cause bits to be misinterpreted after the signal source exits the high-impedance state.

SUMMARY OF THE INVENTION

Some embodiments of the present invention are capable of adjusting the peak-to-peak voltage of a binary signal without the costs and disadvantages of circuits in the prior art. In particular, some embodiments of the present invention adjust the peak-to-peak voltage of a binary signal symmetrically around a reference voltage, without human intervention and without a transient response when the signal source exits the high-impedance state. These advantages can be found in an embodiment of the present invention in which a current source, such as a transistor, five resistors and two diodes create an intelligent "voltage divider."

DETAILED DESCRIPTION

Figure 1:
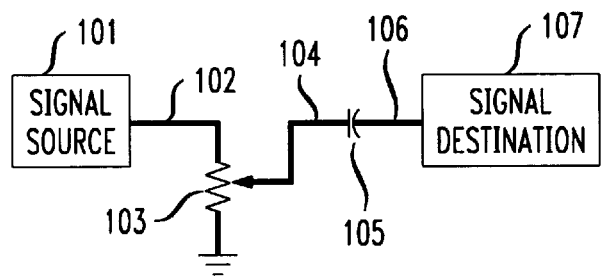
FIG. 1 depicts a schematic diagram of a circuit in the prior art.
Figure 2:
FIG. 2 depicts a graph of the voltage of a typical binary signal that is emitted by the signal source in FIG. 1.
Figure 3:
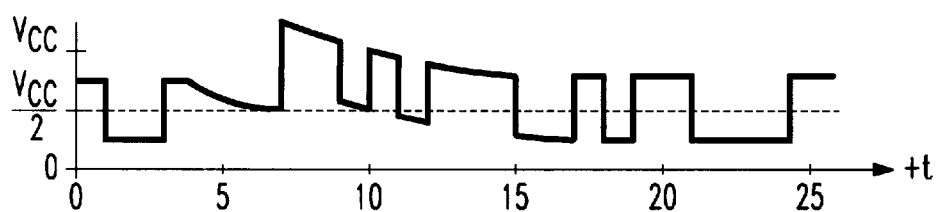
FIG. 3 depicts a graph of the voltage at the input to the signal destination in FIG. 1 in response to the binary signal shown in FIG. 2.
Figure 4:
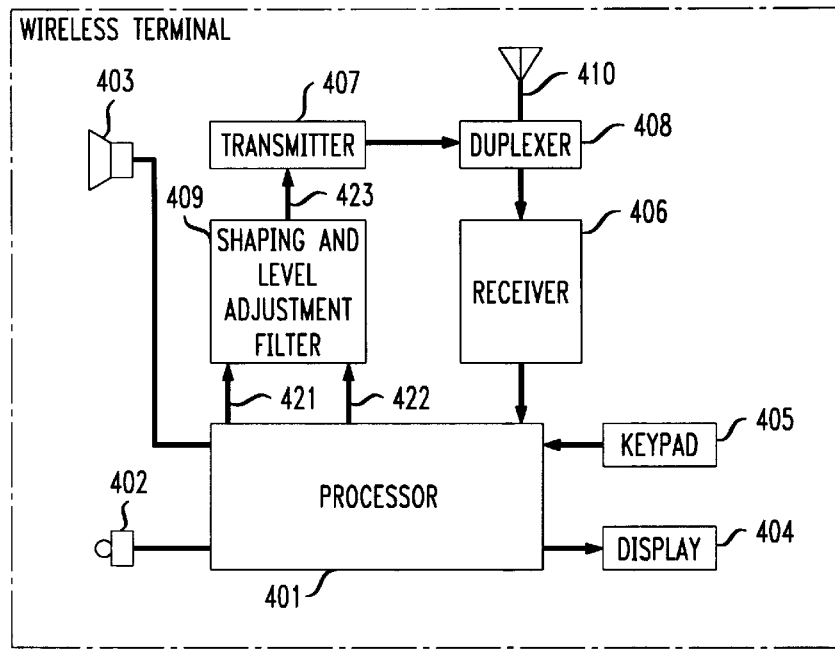
FIG. 4 depicts a block diagram of a wireless terminal in accordance with the present invention.

FIG. 4 depicts a block diagram of a wireless terminal that comprises: processor 401, microphone 402, speaker 403, visual display 404, keypad 405, receiver 406, transmitter 407, duplexor 408, shaping and level adjustment filter 409 and antenna 410, all interconnected as shown. Microphone 402, speaker 403, display 404, keypad 405, receiver 406, duplexor 408 and antenna 410 are all well known in the art and will not be discussed further.

Processor 401 is advantageously an appropriately-programmed general-purpose microprocessor that has the capability to interface with, and coordinate the functions of, the other elements in wireless terminal 400. Processor 401 advantageously outputs two signals to shaping filter 409: a $data_{in}$ signal on lead 421 and a control signal on bus 422. The $data_{in}$ signal is advantageously a binary signal that represents the digitized data that processor 401 desires that transmitter 407 transmit via antenna 410. The output of processor 401 to lead 421 is advantageously a tri-state output. When processor 401 has data that it desires to transmit, the tri-state output is put into the low-impedance state, in well-known fashion, and the binary data is transmitted from processor 401 to shaping filter 409. The output voltage of a binary "1" $data_{in}$ signal is something less than $V_{cc}$ and advantageously is constant throughout the life of wireless terminal 400. Similarly, the output voltage of a binary "0" $data_{in}$ signal is something more than ground and advantageously also is constant throughout the life of wireless terminal 400. When processor 401 does not desire to transmit data, the tri-state output is put into the high-impedance state and, advantageously, no current flows on lead 421.

The control signal on bus 422 is advantageously a digitized value of an analog signal that processor 401 uses to control the peak-to-peak voltage of the $data_{out}$ signal on lead 423. Advantageously, the value of the control signal on bus 422 is determined and set, once, at the factory when wireless terminal 400 is being tested and tuned, and the determined value is loaded, over bus 422, into non-volatile memory 509 (shown in FIG. 5) to fine-tune the peak-to-peak voltage of the signal on lead 423. It will be clear to those skilled in the art how to determine the appropriate value for the control signal loaded into the non-volatile memory and how to make and use processor 401.

Transmitter 407 is advantageously an FM transmitter that accepts a binary $data_{out}$ signal on lead 423 from shaping filter 409 and uses it to modulate the FM carrier prior to transmission. Advantageously, the peak-to-peak voltage of the signal on lead 423 is symmetrically centered around the center of the linear region of operation for transmitter 407, which is typically $V_{cc}/2$, as is well-known in the art. Furthermore, the peak-to-peak voltage of the signal on lead 423 is advantageously controlled and maintained by the control signal on bus 422, which is loaded into non-volatile memory 509 (shown in FIG. 5). Therefore, it is a responsibility of shaping filter 409 to ensure that the peak-to-peak voltage of the signal on lead 423 is symmetrically centered around the voltage $V_{cc}/2$ and that peak-to-peak voltage of the signal on lead 423 does not change. It will be clear to those skilled in the art how to make and use transmitter 407.

Figure 5:
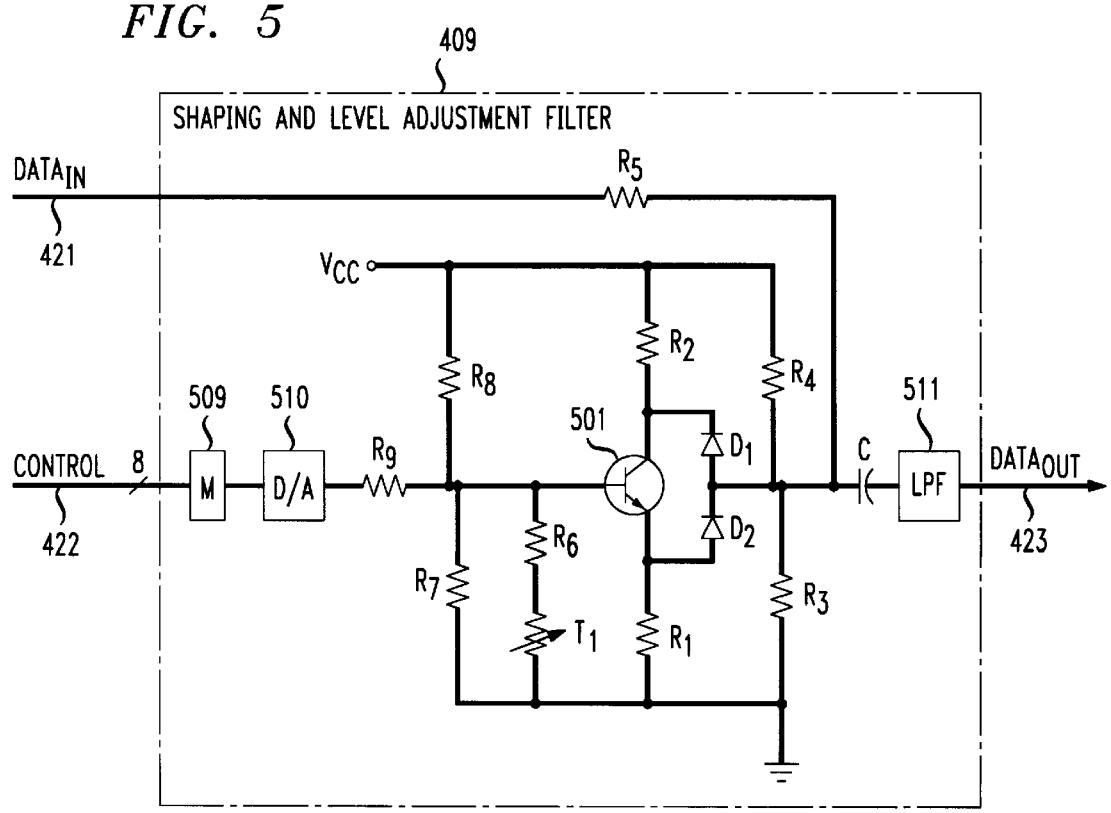
FIG. 5 depicts a schematic diagram of the shaping and level adjustment filter in FIG. 4.

FIG. 5 depicts a schematic diagram of shaping and level adjustment filter 409, which accepts the binary $data_{in}$ signal on lead 421 and control signal on bus 422, and which outputs the $data_{out}$ signal on lead 423. Shaping filter 409 advantageously comprises: nine resistors, $R_1$ through $R_9$, a capacitor, C, two diodes, $D_1$ and $D_2$, one thermistor, $T_1$, a current source such as transistor 501 or an operational-amplifier, nonvolatile memory 509, digital-to-analog converter 510 and low-pass filter 511, interconnected as shown. The diodes are advantageously Schottky diodes because of their low offset voltage. Although in FIG. 5 transistor 501 is depicted as a bipolar-junction transistor, a field-effect transistor will suffice as well.

Nonvolatile memory 509 advantageously accepts the control signal from processor 401 and continuously outputs the digital control signal to digital-to-analog converter 510. Digital-to-analog converter 510 then produces a direct current analog signal whose voltage is determined by the value in nonvolatile memory 509. It will be clear to those skilled in the art how to make and use non-volatile memory 509 and digital-to-analog converter 510.

Capacitor C is used to block any DC current from entering transmitter 407, and low-pass filter 511 advantageously eliminates any high-frequency signal components from entering transmitter 407, as in the prior art. It will be clear to those skilled in the art how to make and use capacitor C and low-pass filter 511.

Transistor 501 and resistors $R_1$ through $R_5$, and diodes $D_1$ and $D_2$ are used: (1) to adjust the peak-to-peak voltage of the $data_{out}$ signal, and (2) to ensure that the peak-to-peak voltage of the $data_{out}$ signal is always centered around $V_{cc}/2$. Advantageously, $R_1=R_2$, $R_3=R_4$ and $R_4>R_5>R_1$. Shaping filter 409 is advantageous in that when processor 401 puts the output to lead 421 in the high-impedance state, the node connecting resistor $R_3$, resistor $R_4$ and capacitor C tends towards the voltage $V_{cc}/2$, which prevents capacitor C from charging, as in the prior art. Furthermore, transistor 501 and resistors $R_1$ through $R_5$, and diodes $D_1$ and $D_2$ ensure that the $data_{out}$ signal, regardless of its peak-to-peak voltage, is always centered around $V_{cc}/2$. It will be clear to those skilled in the art how to determine specific values for resistors $R_1$ through $R_5$ for a given embodiment of the present invention.

Resistors $R_6$ through $R_9$ and thermistor $T_1$ perform two valuable and distinct functions. The first function is to temperature compensate shaping filter 409. Although resistor $R_6$ and thermistor $T_1$ are shown in series and connected to ground, alternatively, they can be in series and connected to $V_{cc}$. Alternatively, resistor $R_6$ can be omitted.

The second function is to effectively compress the range of control voltages that can be output from D/A converter 510 so that there is no reduction in the number of discrete voltage steps that can be output from D/A converter 510. For example, if D/A converter 510 can output 256 discrete steps from 0 to 5 volts in 20 mv. increments, then resistors $R_6$ through $R_9$ can convert the range of the control signal to 2.5 to 3.5 volts with 256 discrete steps in 4 mv steps. This second function is useful because it allows the $data_{out}$ signal to be finely tuned over the realistic range of peak-to-peak voltages. It will be clear to those skilled in the art how to chose values for resistors $R_6$ through $R_9$ and thermistor $T_1$ for a given embodiment of the present invention.

Furthermore, because the peak-to-peak voltage of the $data_{out}$ signal is trimmed under the control of processor 401, the process of trimming can be done automatically and without human intervention. Furthermore, because the peak-to-peak voltage of the dataout signal is trimmed without a mechanical trimming potentiometer, as in the prior art, it is less likely that the circuit will lose tune from vibration and thermal cycling.

Figure 6:
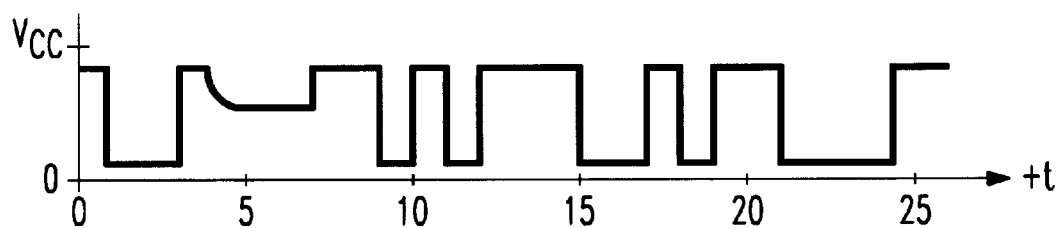
FIG. 6 depicts a graph of the voltage of a typical binary signal on lead 421 in FIG. 5.

FIG. 6 depicts a graph of the voltage on lead 421, which represents an illustrative binary signal from processor 401. For the first four time periods shown, a time-varying binary signal is output by processor 401. At t=4, processor 401 enters the high-impedance state and the voltage on lead 421 falls from its prior value towards $V_{cc}/2$. At t=7, processor 401 exits the high-impedance state and again outputs a time-varying binary signal.

Figure 7:
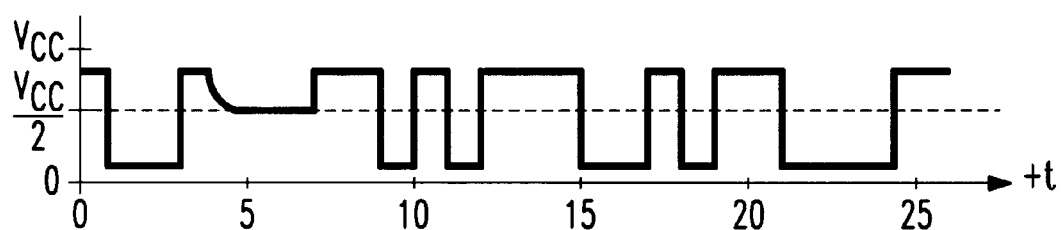
FIG. 7 depicts a graph of the voltage on lead 423 in FIG. 5 in response to the binary signal in FIG. 6.

FIG. 7 depicts a graph of the voltage on lead 423 that is caused by the binary signal on lead 421 in FIG. 6. For the first four time periods, the voltage on lead 423 follows the voltage on lead 421. When at t=4 processor 401 enters the high-impedance state the voltage on lead 423 tends towards $V_{cc}/2$. When at t=7 processor 401 exits the high-impedance state the voltage on lead 423 immediately follows the voltage on lead 421, without a transient response, because capacitor C did not charge when processor 401 was in the high-impedance state.

It is to be understood that the above-described embodiments are merely illustrative of the invention and that many variations may be devised by those skilled in the art without departing from the scope of the invention. It is therefore intended that such variations be included within the scope of the following claims.

What is claimed is:

1. A circuit comprising:
   a current source having a first lead, a second lead and a third lead, wherein a control signal on said third lead of said current source affects the current flow between said first lead of said current source and said second lead of said current source;
   a first resistor, ($R_1$), having a first lead and a second lead, said first lead of said first resistor being electrically connected to said second lead of said current source, and said second lead of said first resistor being electrically connected to ground;
   a second resistor, ($R_2$), having a first lead and a second lead, said first lead of said second resistor being electrically connected to power, and said second lead of said second resistor being electrically connected to said first lead of said current source;
   a first diode, ($D_1$), having a p terminal and an n terminal, said n terminal of said first diode being electrically connected to said first lead of said current source;
   a second diode, ($D_2$), having a p terminal and an n terminal, said n terminal of said second diode being electrically connected to said p terminal of said first diode, and said p terminal of said second diode being electrically connected to said second lead of said current source;
   a third resistor, ($R_3$), having a first lead and a second lead, said first lead of said third resistor being electrically connected to said p terminal of said first diode, and said second lead of said third resistor being electrically connected to ground; and
   a fourth resistor, ($R_4$), having a first lead and a second lead, said first lead of said fourth resistor being electrically connected to power, and said second lead of said fourth resistor being electrically connected to said p terminal of said first diode.

2. The circuit of claim 1 wherein ($R_1$)=($R_2$), ($R_3$)=($R_4$) and ($R_4$)>($R_1$).

3. The circuit of claim 1 further comprising a fifth resistor, ($R_5$), having a first lead and a second lead, said second lead of said fifth resistor being electrically connected to said p terminal of said first diode.

4. The circuit of claim 3 further comprising a capacitor, ($C_1$), having a first lead and a second lead, said first lead of said capacitor being electrically connected to said p terminal of said first diode.

5. The circuit of claim 3 wherein ($R_1$)=($R_2$), ($R_3$)=($R_4$) and ($R_4$)>($R_5$)>($R_1$).

6. The circuit of claim 3 further comprising:
   a sixth resistor, ($R_6$), having a first lead and a second lead, said first lead of said sixth resistor being electrically connected to said third lead of said current source; and
   a thermistor, ($T_1$), having a first lead and a second lead, said first lead of said thermistor being electrically connected to said second lead of said sixth resistor.

7. The circuit of claim 3 further comprising:
   a thermistor, ($T_1$), having a first lead and a second lead, said first lead of said thermistor being electrically connected to said third lead of said current source.

8. The circuit of claim 7 further comprising:
   a seventh resistor, ($R_7$), having a first lead and a second lead, said first lead of said seventh resistor being electrically connected to said third lead of said current source, and said second lead of said seventh resistor being electrically connected to ground; and
   an eighth resistor ($R_8$), having a first lead and a second lead, said first lead of said eighth resistor being electrically connected to power, and said second lead of said eighth resistor being electrically connected to said third lead of said current source.

9. The circuit of claim 8 further comprising a ninth resistor, ($R_9$), having a first lead and a second lead, said second lead of said ninth resistor being electrically connected to said third terminal of said current source.

10. The circuit of claim 1 wherein said current source is a transistor.

11. A wireless terminal comprising:
    a microprocessor for creating a $data_{in}$ signal and a control signal;
    a transmitter for receiving a $data_{out}$ signal; and
    a shaping filter for receiving said $data_{in}$ signal and said control signal from said microprocessor and for creating a $data_{out}$ signal for said transmitter; wherein said shaping filter comprises:
       a current source having a first lead, a second lead and a third lead, wherein said control signal on said third lead of said current source affects the current flow between said first lead of said current source and said second lead of said current source;
       a first resistor, ($R_1$), having a first lead and a second lead, said first lead of said first resistor being electrically connected to said second lead of said current source, and said second lead of said first resistor being electrically connected to ground;
       a second resistor, ($R_2$), having a first lead and a second lead, said first lead of said second resistor being electrically connected to power, and said second lead of said second resistor being electrically connected to said first lead of said current source;
       a first diode, ($D_1$), having a p terminal and an n terminal, said n terminal of said first diode being electrically connected to said first lead of said current source;
       a second diode, ($D_2$), having a p terminal and an n terminal, said n terminal of said second diode being electrically connected to said p terminal of said first diode, and said p terminal of said second diode being electrically connected to said second lead of said current source;
       a third resistor, ($R_3$), having a first lead and a second lead, said first lead of said third resistor being electrically connected to said p terminal of said first diode, and said second lead of said third resistor being electrically connected to ground; and
       a fourth resistor, ($R_4$), having a first lead and a second lead, said first lead of said fourth resistor being electrically connected to power, and said second lead of said fourth resistor being electrically connected to said p terminal of said first diode.

12. The wireless terminal of claim 11 wherein $(R_1)=(R_2)$, $(R_3)=(R_4)$ and $(R_4)>(R_1)$.

13. The wireless terminal of claim 11 further comprising a fifth resistor, $(R_5)$, having a first lead and a second lead, said first lead on said fifth resistor being driven by said $data_{in}$ signal, and said second lead of said fifth resistor being electrically connected to said p terminal of said first diode.

14. The wireless terminal of claim 13 further comprising a capacitor, $(C_1)$, having a first lead and a second lead, said first lead of said capacitor being electrically connected to said p terminal of said first diode.

15. The wireless terminal of claim 13 wherein $(R_1)=(R_2)$, $(R_3)=(R_4)$ and $(R_4)>(R_5)>(R_1)$.

16. The wireless terminal of claim 13 further comprising:
- a sixth resistor, $(R_6)$, having a first lead and a second lead, said first lead of said sixth resistor being electrically connected to said third lead of said current source; and
- a thermistor, $(T_1)$, having a first lead and a second lead, said first lead of said thermistor being electrically connected to said second lead of said sixth resistor.

17. The wireless terminal of claim 13 further comprising:
- a thermistor, $(T_1)$, having a first lead and a second lead, said first lead of said thermistor being electrically connected to said third lead of said current source.

18. The wireless terminal of claim 17 further comprising:
- a seventh resistor, $(R_7)$, having a first lead and a second lead, said first lead of said seventh resistor being electrically connected to said third lead of said current source, and said second lead of said seventh resistor being electrically connected to ground; and
- an eighth resistor $(R_8)$, having a first lead and a second lead, said first lead of said eighth resistor being electrically connected to power, and said second lead of said eighth resistor being electrically connected to said third lead of said current source.

19. The wireless terminal of claim 18 further comprising a ninth resistor, $(R_9)$, having a first lead and a second lead, said second lead of said ninth resistor being electrically connected to said third terminal of said current source.

20. The wireless terminal of claim 11 wherein said current source is a transistor.

* * * * *